(12) United States Patent
Chou

(10) Patent No.: US 7,099,224 B2
(45) Date of Patent: Aug. 29, 2006

(54) MEMORY DEVICE AND METHOD FOR BURN-IN TEST

(75) Inventor: Min-Chung Chou, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 0 days.

(21) Appl. No.: 11/250,073

(22) Filed: Oct. 13, 2005

(65) Prior Publication Data

US 2006/0050599 A1    Mar. 9, 2006

(51) Int. Cl.
*G11C 5/14* (2006.01)

(52) U.S. Cl. .................. 365/226; 365/185.22; 365/201

(58) Field of Classification Search ................ 365/226, 365/185.22, 201

See application file for complete search history.

(56) References Cited

U.S. PATENT DOCUMENTS 6,169,694 B1 *   1/2001   Nam et al. .................. 365/201
6,266,286 B1 *   7/2001   Cho et al. ................... 365/201

* cited by examiner

*Primary Examiner*—Anh Phung
*Assistant Examiner*—Pho M. Luu
(74) *Attorney, Agent, or Firm*—Thomas, Kayden, Horstemeyer & Risley

(57) ABSTRACT

A memory device and a method for burn-in test. The memory device has a plurality of sub-array word line leak-current limited units and a plurality of single word line leak-current limited units. They are used to limit the current in each word line to a predetermined word line current value. In burn-in test mode, the output of a word line driver is kept in a high impedance state. The bit line stress voltage is applied to the row of memory cells through a normal read-write path. A voltage generator for generating a substantially stable voltage is also provided. In burn-in test mode, the even word lines and the odd word lines are grouped separately and the word line stress voltage is applied to the even word lines and to the odd word lines alternately.

3 Claims, 10 Drawing Sheets

MEMORY DEVICE AND METHOD FOR BURN-IN TEST

BACKGROUND

1. Field of Invention

The present invention relates to a memory device. More particularly, the present invention relates to a memory device for a burn-in test and a method for screening out defective dynamic random access memory (DRAM) cells in the wafer state.

2. Description of Related Art

In general, a burn-in test is performed on a semiconductor memory device to prevent reliability problems, and more specifically, after the device has been assembled or packaged. The screened devices, if defective, cannot be repaired with a laser and re-assembled. Volume production is therefore more expensive. The burn-in test is usually performed at a high voltage and high temperature; the semiconductor memory device is operated in read or write mode to screen out possible existent defects in, for example, the gate oxide film of the cell transistor, the storage node and the p/n junctions, the cell capacitor insulator film, the adjacent word lines, the adjacent bit lines, the word lines and the bit lines. But the word line to be active is responsive to the row address in sequence, especially for a DRAM device, and is dependent on the number of refresh cycles. For example, one particular word line can be selected once every 1024 cycles for 4M DRAM, 2048 or 4096 for 16M DRAM, and 4096 or 8192 for 64M DRAM. Besides, the duty cycle of work line and the complement burn-in data "1" and "0" are considerable when evaluating the efficiency of a stressed memory cell. The stress efficiency is low if the burn-in test time cannot be increased, especially for the high-density new generation memory device. Similar problems arise for a column address to access stored data or to write in new data. If all of the word lines are active at the same time and all of the cells are refreshed simultaneously, the burn-in test time and cost is dramatically reduced, especially in the wafer stage.

In consideration of the above, some conventional art exists that includes circuits or methods to increase the burn-in efficiency of a wafer or the package stage. They are briefly described as follows:

In U.S. Pat. No. 5,265,057, all of the word lines can be selected simultaneously or in groups to stress the adjacent word line. The operation power is not applied to the device so that the stress voltage can be input, or a pass gate that connects the boost circuit to the word line driver is turned off, after which the stress voltage can come from an external test pad. The burn-in data is input through the bit line precharge device and is applied to the bit line pair. Then, the burn-in data are written into the cell.

In U.S. Pat. No. 5,293,340, the stress voltage is applied to a predetermined external test pad. Two additional NMOS are then coupled to the bit line pair, respectively, through a PMOS to drive all of the word lines simultaneously, in order to input the burn-in data.

In U.S. Pat. No. 5,381,373, as device operates in a burn-in process, the boost circuit is inactive and shorts the word line power supply to the device operation power supply. The burn-in data also come from the bit line precharge device, besides separating the bit line precharge generator and cell plate voltage generator.

In U.S. Pat. Nos. 5,590,079 and 5,790,465, two NMOS devices connect to pull the NMOS of a word line driver low and only one of the two NMOS can be turned on in normal mode or burn-in mode. In normal operation, one grounded NMOS is turned on for word line noise immunity while the other NMOS is turned on in burn-in test mode for applying the word line stress voltage.

In U.S. Pat. No. 5,638,331, a test circuit is provided to place the NMOS-type word line driver in a high-impedance state. The burn-in background data is written into the memory cell before the burn-in test mode is set, and then the operation voltage is applied to the word lien through a PMOS to stress the gate oxide film.

In U.S. Pat. No. 5,926,423, the cell plate voltage is separated from bit line precharge voltage by a CMOS pass gate at the output of voltage generator. The bit line stress voltage is transferred from the external voltage or the complementary internal input through stress transferring PMOS, then via the bit line precharge NMOS to the bit line.

In U.S. Pat. No. 6,055,199, a bit line precharge circuit is connected to an external test pad for supplying a bit line stress voltage and bit line precharge device and memory cells. Word lines are partitioned into odd and even addresses, and the bit line stress voltage is supplied via the bit line precharge device to memory cells. Then, a cell checker pattern is realized.

In U.S. Pat. No. 6,169,694, a fully on-chip wafer level burn-in test circuit is described. It includes three main circuits. A high voltage generating unit generates the word line stress voltage for screening out gate oxide defects. The bit line precharge voltage and the cell plate voltage are supplied by the bit line precharge voltage generating unit and the cell plate voltage generating unit, respectively. The burn-in data is entered through bit line precharge device and the cell plate voltage is used to stress a memory cell.

In the prior art described above, the gate oxide stress voltage can be supplied by an external power supply via a predetermined external test pad or an internal high voltage generator. No matter what kind of voltage source the chip designer selects, a maximum current that voltage source can supply always exists. For example, a word line defect is burned out successfully during the burn-in test, or there are inherent word line related defects. Both result in a leakage path on the word line. In an extreme case, this defect causes the word line to short directly to the ground, so the leakage current is too large to be supplied by the voltage source. The word line stress voltage then largely decreases because the voltage source cannot support the leakage current. When the stress voltage is reduced, the electric field across gate oxide film becomes insufficient. Therefore, no more gate oxide related defects are screened.

Further, in the conventional wafer level burn-in test method, the burn-in background data is written either through a bit line precharge device or via additional device coupled to the bit line. In such a method, the cell plate voltage needs to be separated from the bit line precharge voltage. The former is used to stress the cell capacitor insulator film and the later is used to write in burn-in data. The bit line and bit line bar usually have the same voltage level and no electric field exists between them. This method cannot screen out the defects relative to an adjacent bit line. Another disadvantage is that the separate voltage levels have different responses to ground noise, which is always something against bit line signal sensing in normal operation.

SUMMARY

Therefore, the present invention provides a memory device, a burn-in test circuit, and a method to solve the problems in the conventional burn-in test.

An object of the present invention is to provide a memory device and a burn-in test circuit capable of maintaining the stress condition when fatal defects exist during a burn-in test.

Another object of the present invention is to provide a memory device, a burn-in test circuit, and a method capable of placing the word line driver in a high impedance state so that the word line stress voltage can be input from a leak-current limited unit.

Still another object of the present invention is to provide a memory device and a burn-in test circuit capable of writing the burn-in background data through the normal data read-write path.

Yet another object of the present invention is to provide a voltage generator capable of supplying the voltage for a bit line precharge voltage and a cell plate voltage in normal mode and that can be turned off in a burn-in test mode.

A further object of the present invention is to provide a memory device, a burn-in test circuit, and a method capable of increasing the burn-in test efficiency and reducing the burn-in test time.

According to one aspect of the present invention, a memory device for a burn-in test is described. The memory device includes an array of memory cells, a plurality of word lines, a plurality of bit lines, and a leak-current limited unit. The leak-current limited unit is connected to the memory array via the plurality of word lines.

During the burn-in test, the leak-current limited unit limits the current in each work line to a predetermined word line current value and a word line stress voltage is provided via the leak-current limited unit to stress each column of memory cells connected to one word line.

The leak-current limited unit includes a plurality of sub-array word line leak-current limited units and a plurality of single word line leak-current limited units. Each sub-array word line leak-current limited unit is connected to a number of word lines. The sub-array word line leak-current limited unit limits the total current flowing through the number of word lines to a predetermined sub-array current value.

The predetermined sub-array current value is related to the number of spare word lines. Each single word line leak-current limited unit is connected to one word line and limits the current in the word line to the predetermined word line current value. Because the current flowing in one word line is limited, the voltage source is capable of supplying sufficient voltage to stress all word lines. Therefore, the memory device is capable of maintaining the stress condition when fatal defects exist during a burn-in test.

According to another aspect of the present invention, a method for keeping the output of a word line driver in a high impedance state during a burn-in test is described. The word line driver has a cross-coupled load.

The method includes the following steps. First, each MOS transistor is kept at high impedance. Next, a predetermined high voltage is applied to the cross-coupled load. A predetermined low voltage is then provided to the output of the word line driver via a word line. The method is capable of placing the word line driver in a high impedance state so that the word line stress voltage can be input from a leak-current limited unit.

According to another aspect of the present invention, a switch circuit for switching between a normal data-in path and a burn-in test path is described. In normal mode, a read-write operation of a row of memory cells connected to a bit line is performed via the normal data-in path. In burn-in test mode, a bit line stress voltage is applied to the row of memory cells via the burn-in test path to perform the burn-in test. Therefore, the switch circuit is capable of writing the burn-in background data through the normal data read-write path.

According to another aspect of the present invention, a voltage generator for generating a substantially stable voltage is described. The voltage generator includes a voltage dividing circuit, a first differential amplifier, a second differential amplifier, a first switch, and a second switch. The voltage generator supplies the cell plate voltage and the bit line precharge voltage in the normal mode. In burn-in test mode, the generator is turned off and the cell plate voltage is input from an external test pad to stress the storage capacitor.

According to another aspect of the present invention, a method for performing a burn-in test on a memory device is described in the following steps. First, a predetermined high voltage is applied to the cross-coupled load of the word line drivers. Next, the memory device is informed with a burn-in test mode signal.

Next, a word line stress voltage is applied to the word lines. Next, a cell plate voltage is applied to the storage capacitors of the array of memory cells. Next, a bit line stress voltage is applied to the bit lines. The method includes disabling the sense amplifier control signal and turning on all sub-array word line drivers and bit switches. The method is capable of increasing the burn-in test efficiency and reducing the burn-in test time.

It is to be understood that both the foregoing general description and the following detailed description are examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
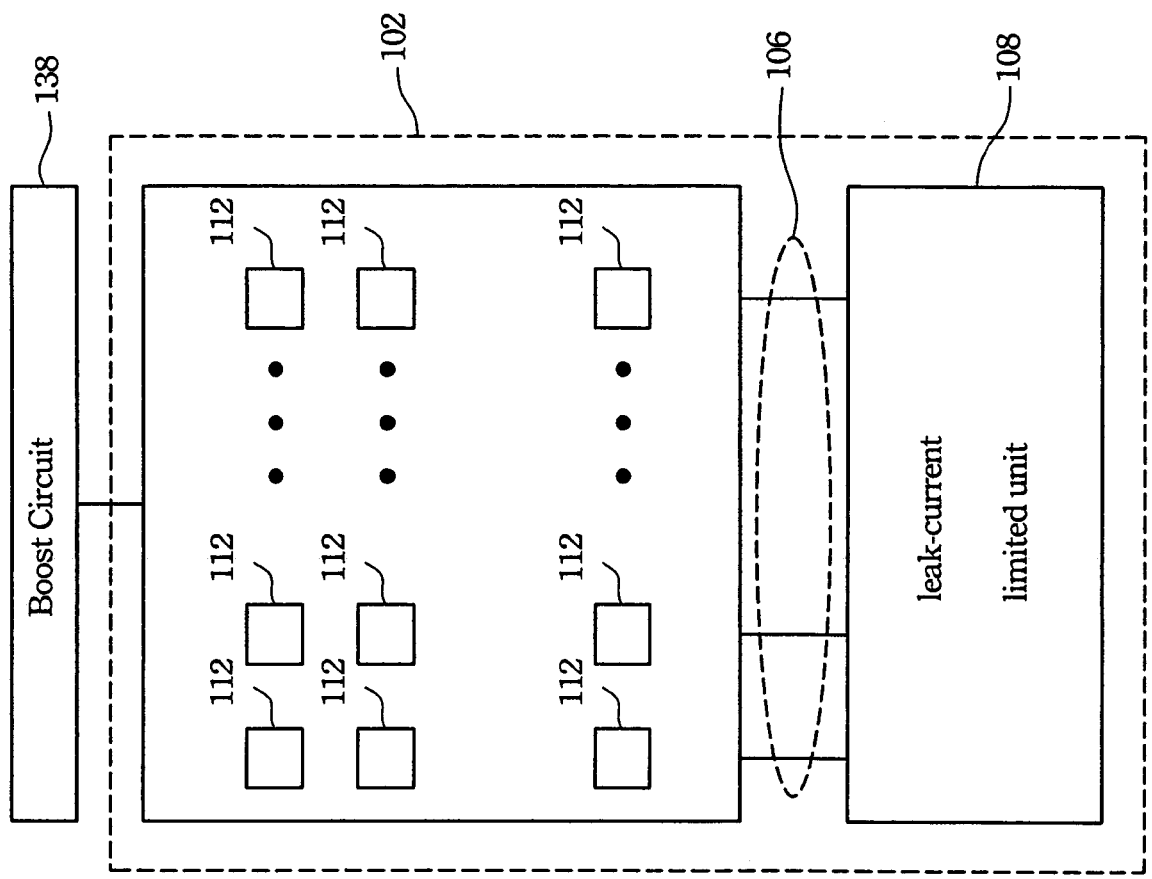
FIG. 1A is a block diagram illustrating the preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
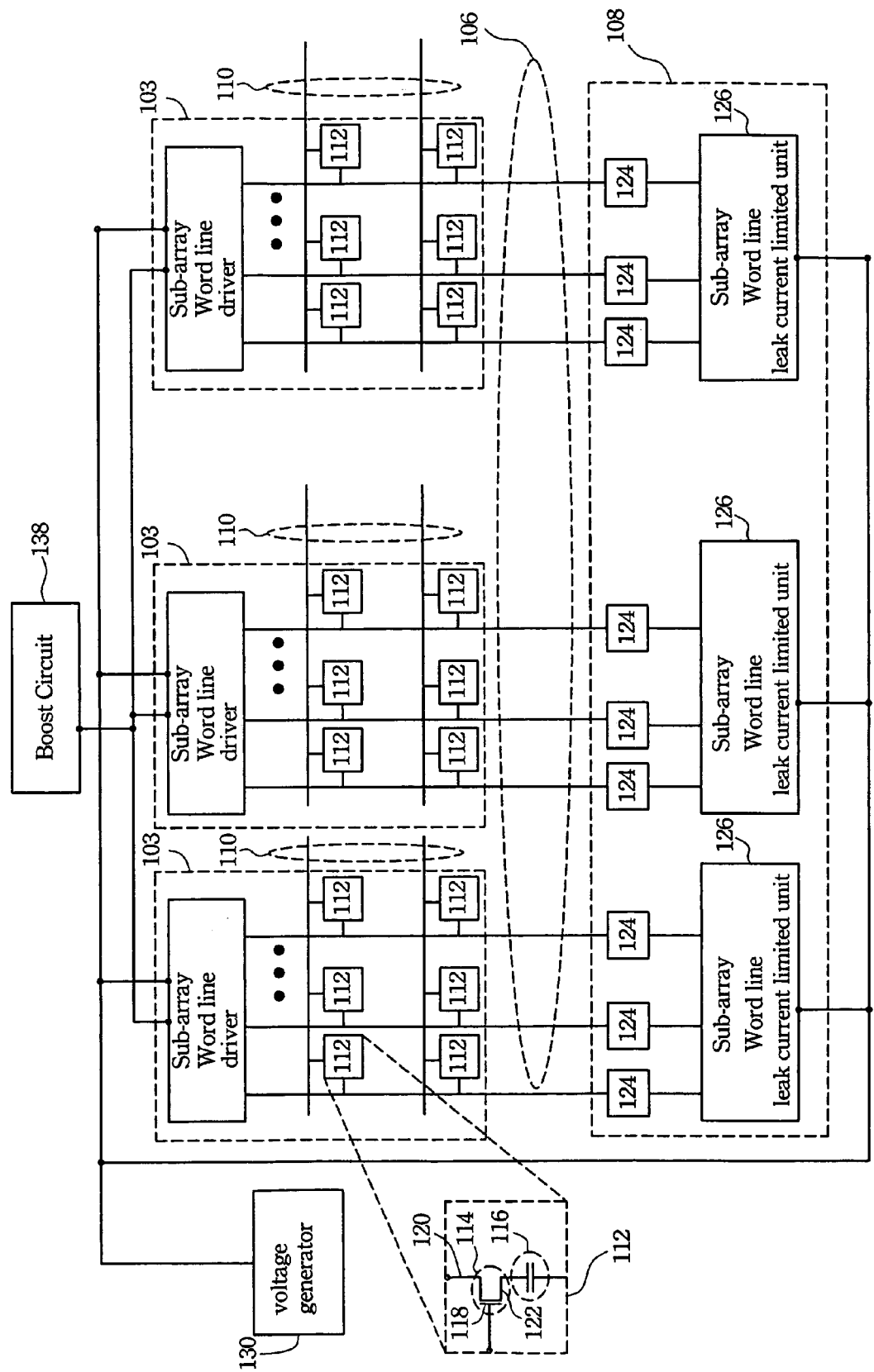
FIG. 1B is a block diagram illustrating the detail structure of the preferred embodiment of the invention.

FIG. 1A is a block diagram illustrating the preferred embodiment of the invention. FIG. 1B is a block diagram illustrating the detail structure of the preferred embodiment of the invention. With reference to FIG. 1A and FIG. 1B, the memory device 102 includes an array of memory cells 112, a plurality of word lines 106, a plurality of bit lines 110, and a leak-current limited unit 108.

Each word line 106 is connected to a column of the array of memory cells 112. Each bit line 110 is connected to a row of the array of memory cells 112. The leak-current limited unit 108 is connected to the memory array 102 via the plurality of word lines 106.

The memory cell 112 is, for example, a DRAM cell. With reference to FIG. 1A and FIG. 1B, each memory cell 112 includes an access transistor 114 and a storage capacitor 116. The gate 118 of the access transistor 114 is connected to one word line. The drain 120 of the access transistor 114 is connected to one bit line. The source 122 of the access transistor 114 is connected to the storage capacitor 116.

With reference to FIG. 1B, for example, the leak-current limited unit 108 includes a plurality of single word line leak-current limited units 124 and a plurality of sub-array word line leak-current limited units 126. Each single word line leak-current limited unit 124 is connected to one word line and limits the current in the word line to a predetermined word line current value.

Each sub-array word line leak-current limited unit 126 is connected to a number of word lines and limits the total current flowing through the number of word lines to a predetermined sub-array current value. The sub-array word line leak-current limited units 126 are connected to the word lines via the single word line leak-current limited units 124.

Figure 1C:
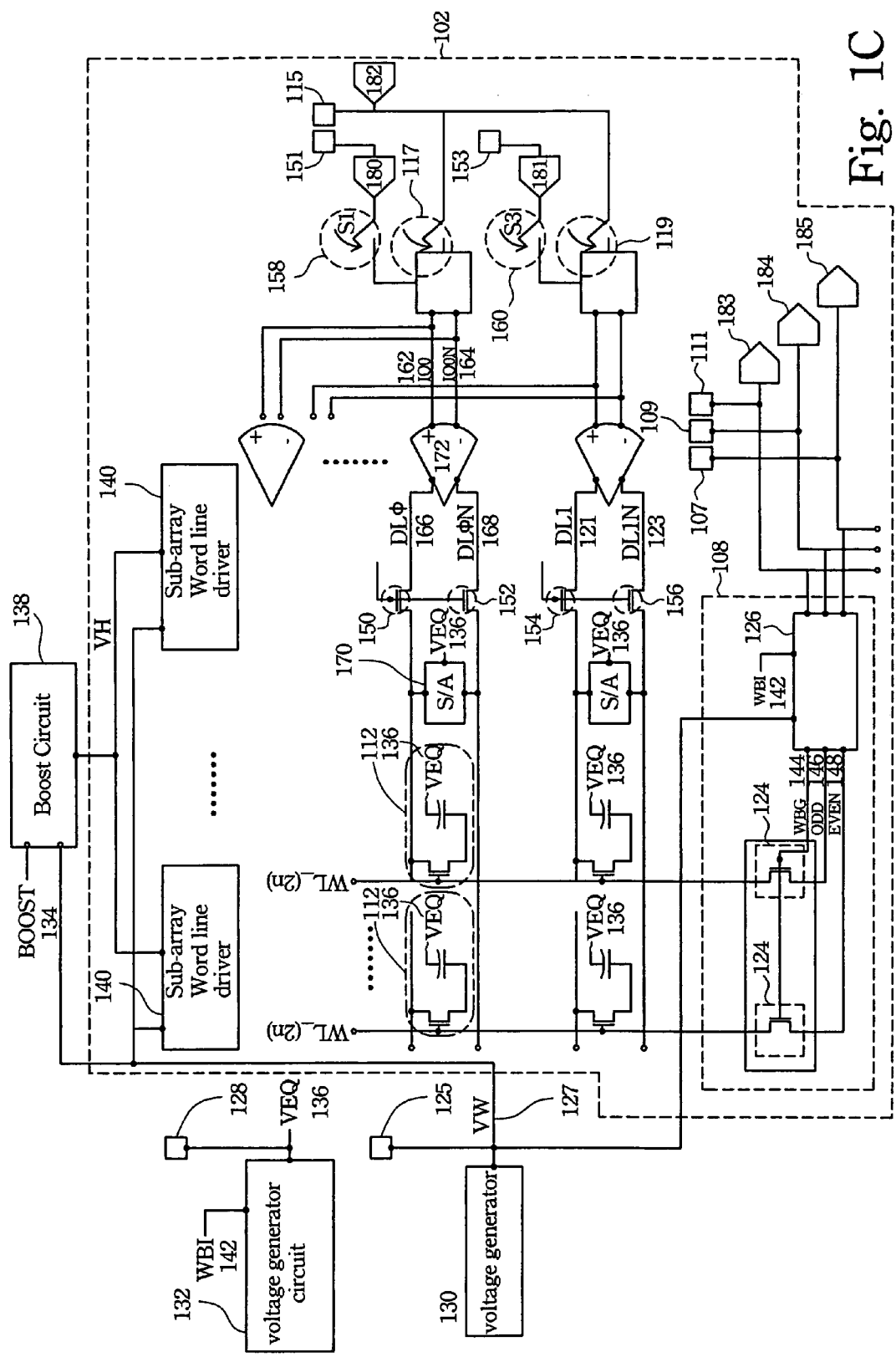
FIG. 1C is a circuit diagram illustrating an example of the preferred embodiment of the invention.

FIG. 1C is a circuit diagram illustrating an example of the preferred embodiment of the invention. The single word line leak-current limited unit 124 is, for example, a MOS transistor. FIG. 2B is a circuit diagram of an example of the boost circuit 138, the sub-array decoder 262, the word line driver 208, the single word line leak-current limited unit 124 and the sub-array word line leak-current limited unit 126. As an example for the sub-array word line leak-current limited unit 126, the sub-array word line leak-current limited unit 126 includes at least one level shifter and each level shifter is used to limit current.

With reference to FIG. 1C and FIG. 2B, in normal mode, the burn-in test mode signal, WBI 142, is at the low state. Pad 125 and 128 can be monitored during normal mode. Pads 125 and 128 can be forced during burn-in test mode. The voltage generator 130 generates a predetermined high voltage 127, VW, to n-wells of all PMOS. In FIG. 2B, the sources or drains of the PMOS transistors 204 and 206 connect to the word lines 106 via the single word line leak-current limited units 124.

The voltage generator circuit 132 generates voltage VEQ 136 for the cell plate voltage and the bit line precharge voltage. The signal BOOST 134 is an external RAS command related signal. When a RAS command is issued, BOOST 134 goes high to enable the boost circuit 138. The boost circuit 138 then dumps charge to the word line according to the row address. The sub-array word line driver 140 is active and decided by the row address.

In normal mode, the single word line leak-current limited unit 124 and the sub-array word line leak-current limited units 126 are disabled by WBI 142, so node WBG 144, ODD 146 and EVEN 148 are all kept at low state. The bit switch 150, 152 or 154, 156 are decided by column address. In a write cycle, the input data is input from pad 151 and 153. Meanwhile, switch S1 158 and S3 160 are turned on. The input data is then input to the IO line (IO0 162, IO0N 164). Then, the input data is sent to the data line (DLφ 166, DLφN 168) by the amplifier 172. The input data is written to a sense amplifier 170 via the bit switch 150 and 152. Finally, the memory cell 112 is charged or discharged by the sense amplifier 170.

In burn-in test mode, the burn-in test mode signal, WBI 142, is set to a high state. When the WBI 142 is at high state, all the input buffers 180, 181, 182, 183, 184, and 185 are disabled; the boost circuit 138 is enabled to assist the word line driver 208 in a high impedance state; all sub-array word line drivers 140 are active; all bit switches are selected and turned on; and all the sense amplifiers are turned off by disabling the sense amplifier control signals.

The predetermined high voltage 127, VW, is input from pad 125. At this time, the predetermined high voltage 127, VW, is forced to be higher than the original designed value from voltage generator 130. The voltage generator 130 is disabled automatically to avoid voltage contention between the voltage generator 130 and the predetermined high voltage 127, VW. Pad 107, 109, and 111 are used to construct the word line burn-in type simultaneously or alternately for the word lines 106. That means turning on the signal WBG 144 at high state if signal ODD 146 and EVEN 148 are both high. Then, the word lines 106 are stressed at the same time. Another example is that the signal ODD 146 and EVEN 148 are set high and low alternately and then the word lines 106 are stressed in groups alternately.

The bit line stress voltage is input from pad 115. The switch 117 and 119 are turned on to pass the bit line stress voltage via the normal read-write path to the data line (DLφ 166, DLφN 168 and DL1 121, DL1N 123). Because all the bit switches and all the sense amplifiers are turned on and turned off, respectively, the bit line stress voltage is written into memory cells 112 easily. The voltage generator circuit 132 is disabled by WBI 142 during burn-in test mode, so the cell plate voltage, VEQ 136, is forced from pad 128 to stress the insulator film of the storage capacitor 116 (shown in FIG. 1B) with data stored.

Figure 2A:
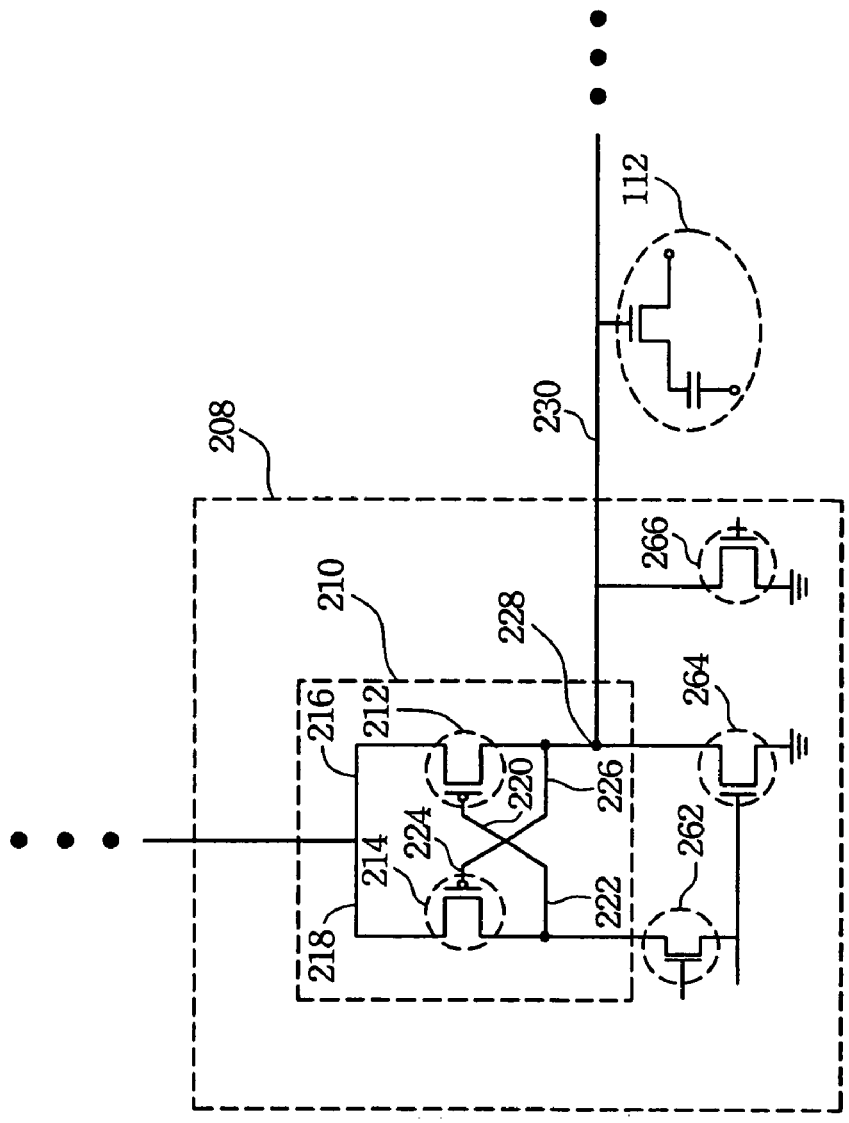
FIG. 2A is a diagram illustrating a part of the word line driver.
Figure 2B:
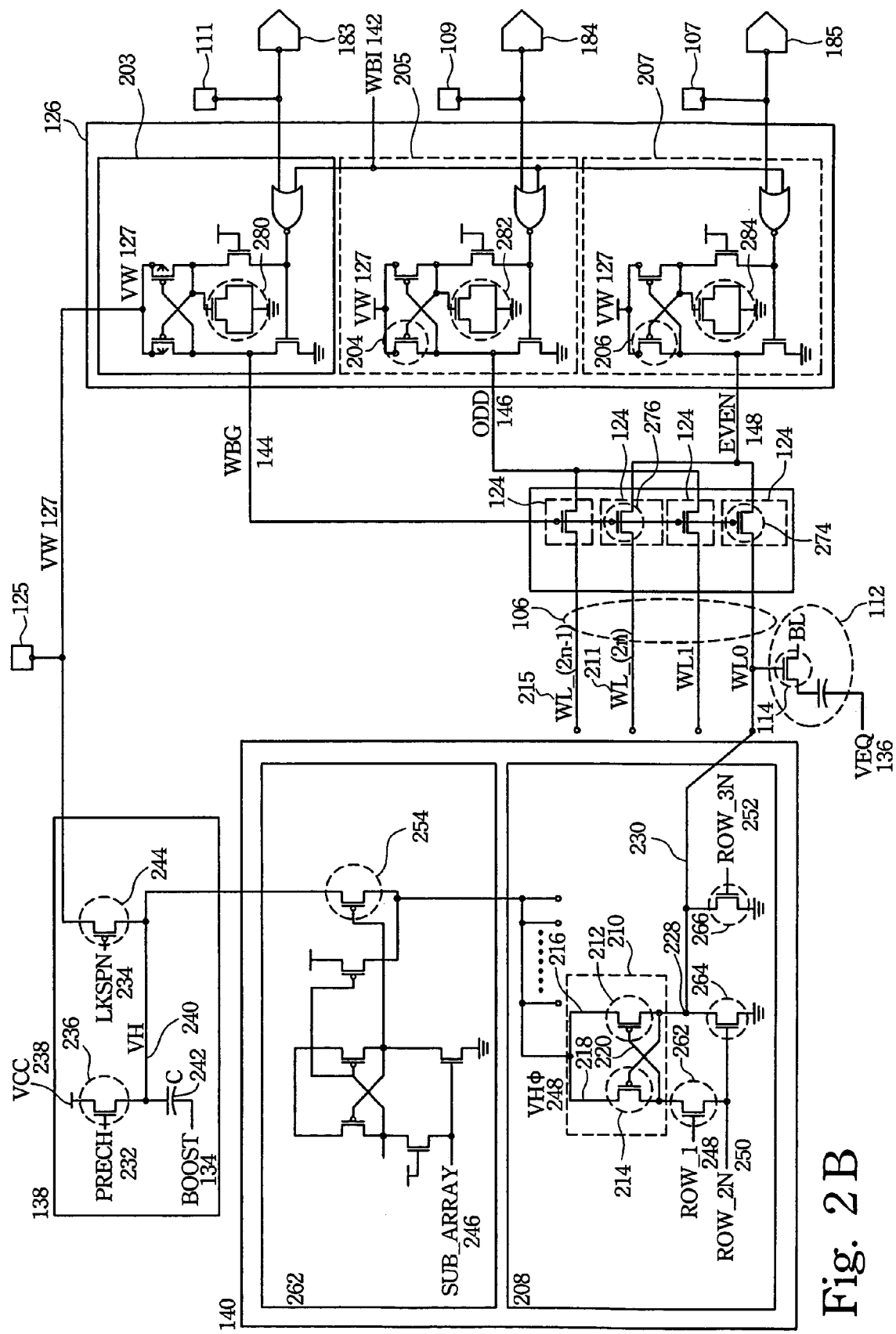
FIG. 2B is a circuit diagram of an example of the boost circuit, the sub-array decoder, the word line driver, the single word line leak-current limited unit and the sub-array word line leak-current limited unit.

FIG. 2A is a diagram illustrating part of the word line driver. With reference to FIG. 2A and FIG. 2B, the word line driver 208 has a cross-coupled load 210. The cross-coupled load 210 includes a first PMOS transistor 212 and a second PMOS transistor 214.

The source 216 of the first PMOS transistor 212 is connected to the source 218 of the second PMOS transistor 214. The gate 220 of the first PMOS transistor 212 is connected to the drain 222 of the second PMOS transistor 214. The gate 224 of the second PMOS transistor 214 is connected to the drain 226 of the first PMOS transistor 212. The output 228 of the word line driver 208 is located at the drain 226 of the first PMOS transistor 212. The word line 230 is connected to the memory cell 112 and the output 228 of the word line driver 208.

FIG. 2B is a circuit diagram of an example of the boost circuit 138, the sub-array decoder 262, the word line driver 208, the single word line leak-current limited units 124 and the sub-array word line leak-current limited unit 126. In normal mode, PRECH 232 is at high state; LKSPN 234 is at high state; and BOOST 134 is at low state. The MOS transistor 236 is used to precharge the node VH 240 to the power level of VCC 238, the highest voltage during normal mode, before issuing a RAS command. When a RAS command is issued, PRECH 232 is at low state; LKSPN 234 is at low state; and BOOST 134 is at high state. The charge stored on the capacitor C 242 is dumped to the node VH 240 and the PMOS transistor 244 is used to sustain the leakage current of an active word line for a long RAS cycle operation.

In normal mode, one or more sub-array word line drivers 140 are selected, so the signal SUB_ARRAY 246 goes to high state and the voltage level of the node VHφ 248 is transferred from VCC 238 to VH 240. One set of row address decides the signal ROW_248 at high state, ROW_2N 250 at low state, and ROW_3N 252 at low state, so that one word line is active. The boost charge is transferred to the gate of the access transistor 114 via the MOS transistor 254 and the PMOS transistor 212 turns on the memory cell 112 for a read or write operation. Because WBI 142 is at low state, the output of the sub-array word line leak-current limited unit 126, which includes three level shifters 203, 205, and 207, are at low state, i.e. WBG 144, ODD 146, and EVEN 148 are at low state, and the NMOS in the single word line leak-current limited units 124 are off.

In burn-in test mode, with reference to FIG. 2A, a method for keeping the output 228 of the word line driver 208 in a high impedance state is described in the following example. First, each MOS transistor (264 and 266), excluding the first PMOS transistor 212 and the second PMOS transistor 214, is kept at high impedance. The MOS transistor 264 and 266 are in the word line driver 208 and are connected to the output 228 of the word line driver 208.

Next, the predetermined high voltage 127, VW, is applied to the source 216 of the first PMOS transistor 212, so that both of the sources of the first PMOS transistor 212 and the second PMOS transistor 214 are kept at the predetermined high voltage 127, VW. Next, a predetermined low voltage is provided to the output 228 of the word line driver 208 via a word line 230.

A circuit diagram illustrating the method for keeping the output 228 of the word line driver 208 in high impedance state is provided in detail in FIG. 2B. With reference to FIG. 2B, in burn-in test mode, WBI 142 is at high state; boost circuit 138 is enabled; PRECH 232 is at low state; LKSPN 234 is at low state; BOOST 134 is at high state; all sub-array word line drivers 140 are selected; all sub-array decoders 262 are also active; and the voltage of node VHφ 248 is equal to the predetermined high voltage 127, VW, because both the PMOS transistor 244 and the MOS transistor 254 are on. The WBI 142 sets ROW_1 248 at low state, ROW_2N 250 at low state, and ROW_3N 252 at low state, i.e. MOS transistor 262, MOS transistor 264 and MOS transistor 266 are off.

Early during the burn-in test mode, the pad 107 and 109 are at low state. The pad 111 is set to high state first, so WBG 144 is at high state, ODD 146 and EVEN 148 are at low state, the predetermined low voltage, so the PMOS transistor 214 of the word line driver 208 is turned on and the gate 220 of the PMOS transistor 212 is pulled to the predetermined high voltage 127, VW to turn off the PMOS transistor 212. Therefore, the MOS transistor 264, 266, and the PMOS transistor 212 of the word line driver 208 coupled to the word line 230 are off. Thus, the word line driver 208 is placed in a high impedance state.

During the burn-in test mode, test pad 109 and 107 go high or low alternately, so the outputs of the level shifter 205 and the level shifter 207 are equal to VW 127 or VSS, the lowest voltage during burn-in test mode. It depends on the test timing pattern. For example, the pad 111 and 107 are at high state and the pad 109 is at low state. Then, WBG 144 and EVEN 148 are at the level of VW 127 and ODD 146 is at low state. Therefore, the even word lines, WL0 230 . . . WL_(2n) 211, are pulled high to VW-Vthn that is exactly the word line stress voltage. Vthn is the threshold voltage of the MOS transistors in the single word line leak-current limited units 124. Even under this test condition, PMOS transistor 214 is turned off or somehow a leakage path in the gate 220 of the PMOS transistor 212 exists. The gate 220 of the PMOS transistor 212 is not kept at the level of VW 127 to keep the PMOS transistor 212 off, the word line stress voltage still keeps in VW-Vthn or VW 127.

The MOS transistors in single word line leak-current limited units 124 act as a current limit that specifies the maximum current passed to a single word line or the maximum sustain leakage current, the predetermined word line current value, for a single defected word line. The word line stress voltage, VW-Vthn, is provided via the leak-current limited unit 108 (shown in FIG. 1A) to stress each column of memory cells 112 connected to one word line. The level shifters is 203, 205 and 207 act as another current limit that specifies the maximum word line stress current, the predetermined sub-array current value, for a sub-array 103 (shown in FIG. 1B). The predetermined sub-array current value in the sub-array word line leak-current limited unit 126 is dependent on the number of spare word lines.

The predetermined sub-array current value is between a first current value and a current value sum. The first current value is the maximum current value which spare word lines are capable of supporting. The current value sum is the sum of the first current value and a second current value. The second current value is the current value that an additional spare word line is capable of supporting.

For example, there are two spare word lines in one sub-array that can be used to replace the defective word lines. If the predetermined word line current value is set to 300 uA, then the maximum current of the PMOS transistors 204 in the level shifter 205 or the PMOS transistors 206 in the level shifter 207 is set in the range of 600 uA–900 uA. In this example, the first current value, 600 uA, is the maximum current value that the spare word lines are capable of supporting. The second current value, 300 uA, is the current value that an additional spare word line is capable of supporting. The current value sum, 900 uA, is the sum of the first current value, 600 uA, and the second current value, 300 uA. Therefore, the predetermined sub-array current value is between a first current value, 600 uA, and a current value sum, 900 uA. A die with a leakage current bigger than 900 uA has to be given up, since no more spare word line can be used.

Further, the word line stress voltage has to be maintained at a sufficiently high level to stress other dies, especially in a wafer level parallel test. Actually, if a voltage generator 130 supplies too much current for a few defective word lines, there is nothing left for other word lines and results in ineffective burn-in. In extreme case, the word line stress voltage drops too much because the leakage current is greater than a voltage source can supply.

The total current flowing into the memory device 102 (shown in FIG. 1A) is limited to a predetermined total current. The predetermined total current is less than the maximum current value that the voltage source is capable of providing. The voltage source provides the word line stress voltage to the memory device 102.

In FIG. 2B, the MOS transistor 280, 282, and 284 act as the loads for the level shifters 203, 205, and 207, respectively, to slow down the transition of the level shifters 203, 205, and 207 and to minimize the peak current during the burn-in test mode.

Figure 3A:
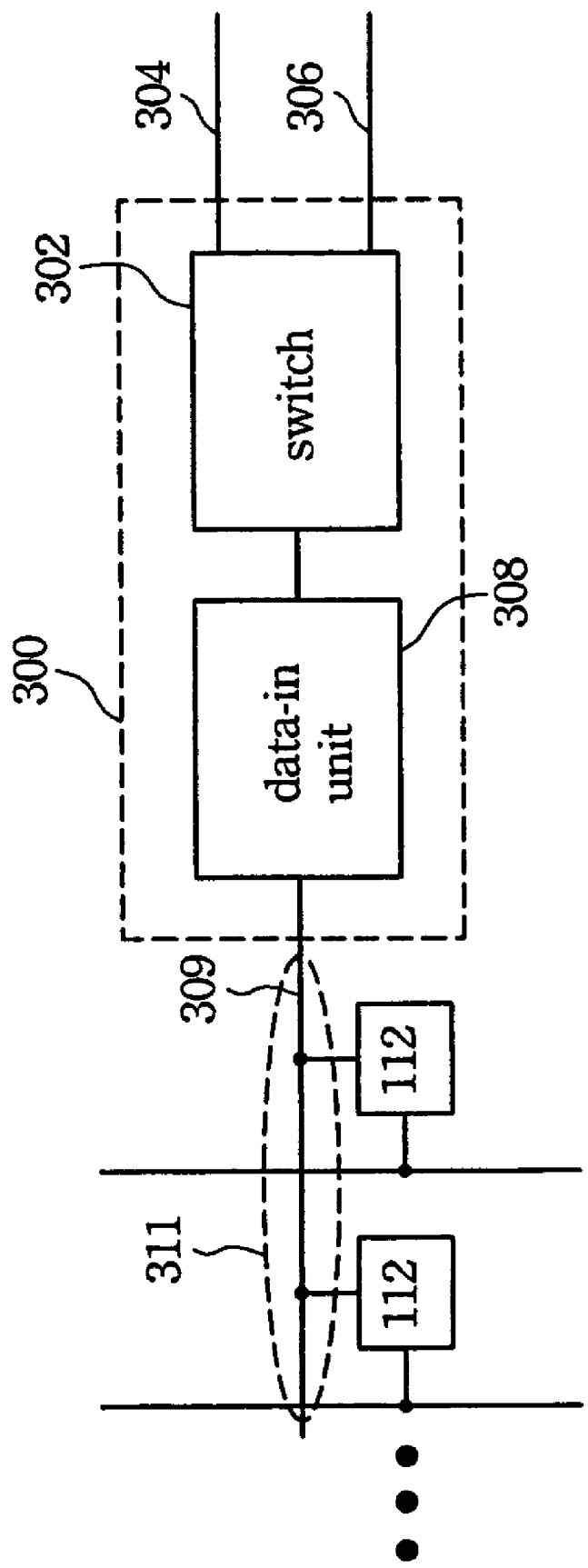
FIG. 3A is a block diagram illustrating the switch circuit of the invention.

FIG. 3A is a block diagram illustrating the switch circuit of the invention. With reference to FIG. 3A, the switch circuit 300 is used for switching between a normal data-in path 304 and a burn-in test path 306 in a burn-in test on a row of memory cells 112. The switch circuit 300 includes a data-in unit 308 and a switch 302.

The data-in unit 308 sends input data to the row of memory cells 112 via a bit line 309 connected to the row of memory cells 112. The switch 302 is connected to the data-in unit 308 for switching between the normal data-in path 304 and the burn-in test path 306. The switch 302 sends the input data selected from the normal data-in path 304 and the burn-in test path 306 to the data-in unit 308.

In normal mode, a read-write operation of the row of memory cells 112 connected to the bit line 309 is performed via the normal data-in path 304. In burn-in test mode, a bit line stress voltage is served as the input data and is applied to the row of memory cells 112 via the burn-in test path 306 to perform the burn-in test.

Figure 3B:
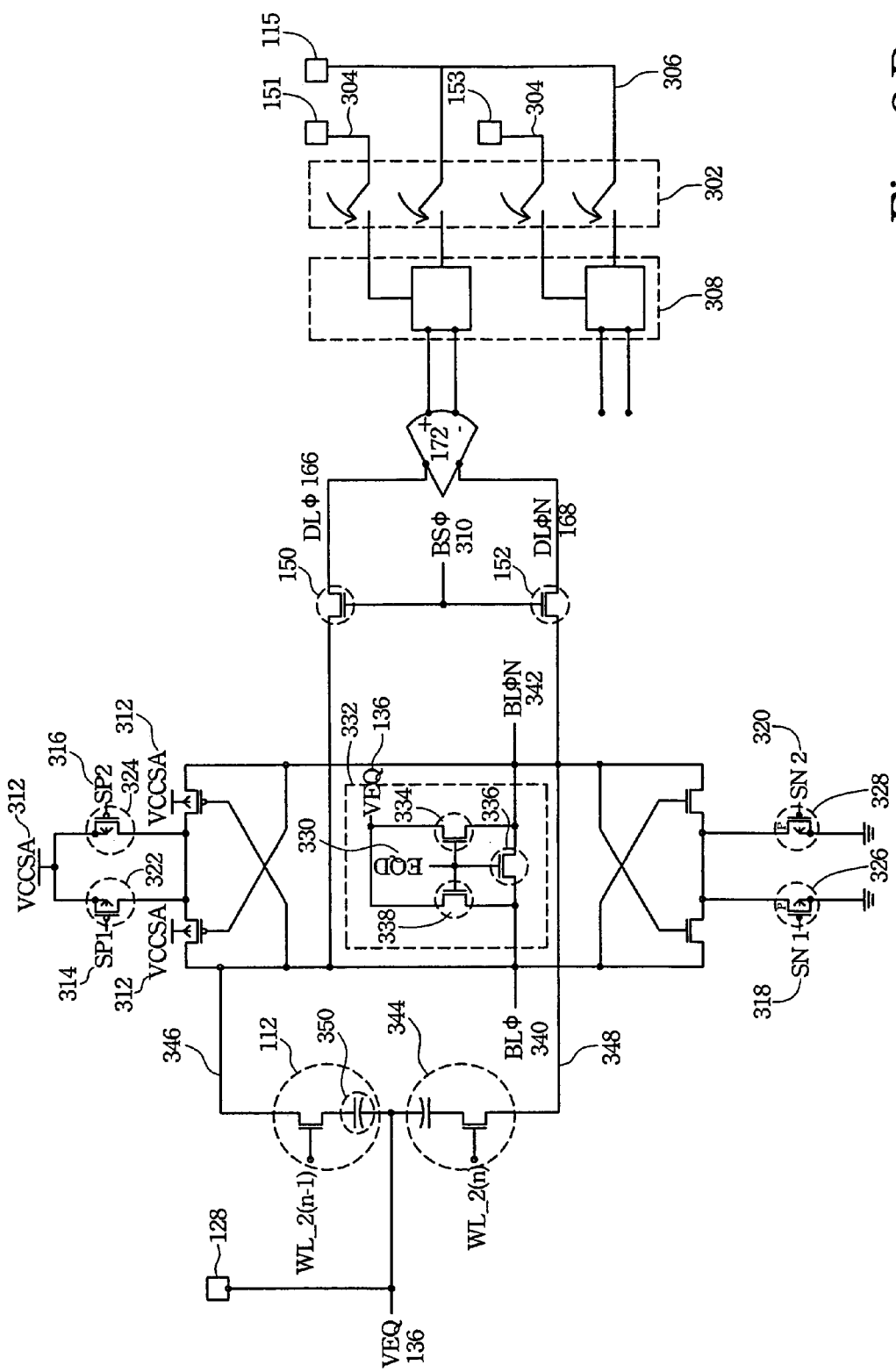
FIG. 3B is a circuit diagram explaining the burn-in data written via the normal read-write path to a memory cell.

FIG. 3B is a circuit diagram explaining the burn-in data write path that via the burn-in test path 306 and the normal read-write path 311 to a memory cell 112. In burn-in test mode, all of the bit switches are turned on. Both BSφ 310 and VCCSA 312 are equal to VCC. The sense amplifier control signals are set to the off state. SP1 314 and SP2 316 are all at high state. SN1 318 and SN2 320 are all at low state. PMOS transistors 322, 324 and NMOS transistors 326, 328 are off. EQD 330 is at low state. The bit line precharge device 322 is off. MOS transistors 334, 336, and 338 are off. The burn-in background data serves as the input data and is input from pad 115 through the burn-in test path 306 and the amplifier 172 to DLφ 166 and DLφN 168 complementary.

For example, DLφ 166 is equal to VCC; DLφN 168 is equal to VSS; BLφ 340 is equal to VCC-Vthn'; and BLφN 342 is equal to VSS. Vthn' is the threshold voltage of the bit switches 150 and 152. For a stressed word line, a memory cell 112 coupled thereto is written to VCC-Vthn' or VSS, depending on whether the memory cell 112 is coupled to the bit line 346 or the bit line bar 348. The cell plate voltage, VEQ 136, is forced from the test pad 128, so the insulator film of the storage capacitor 350 is stressed between VEQ 136 and VCC-Vthn' or between VEQ 136 and VSS.

Figure 4:
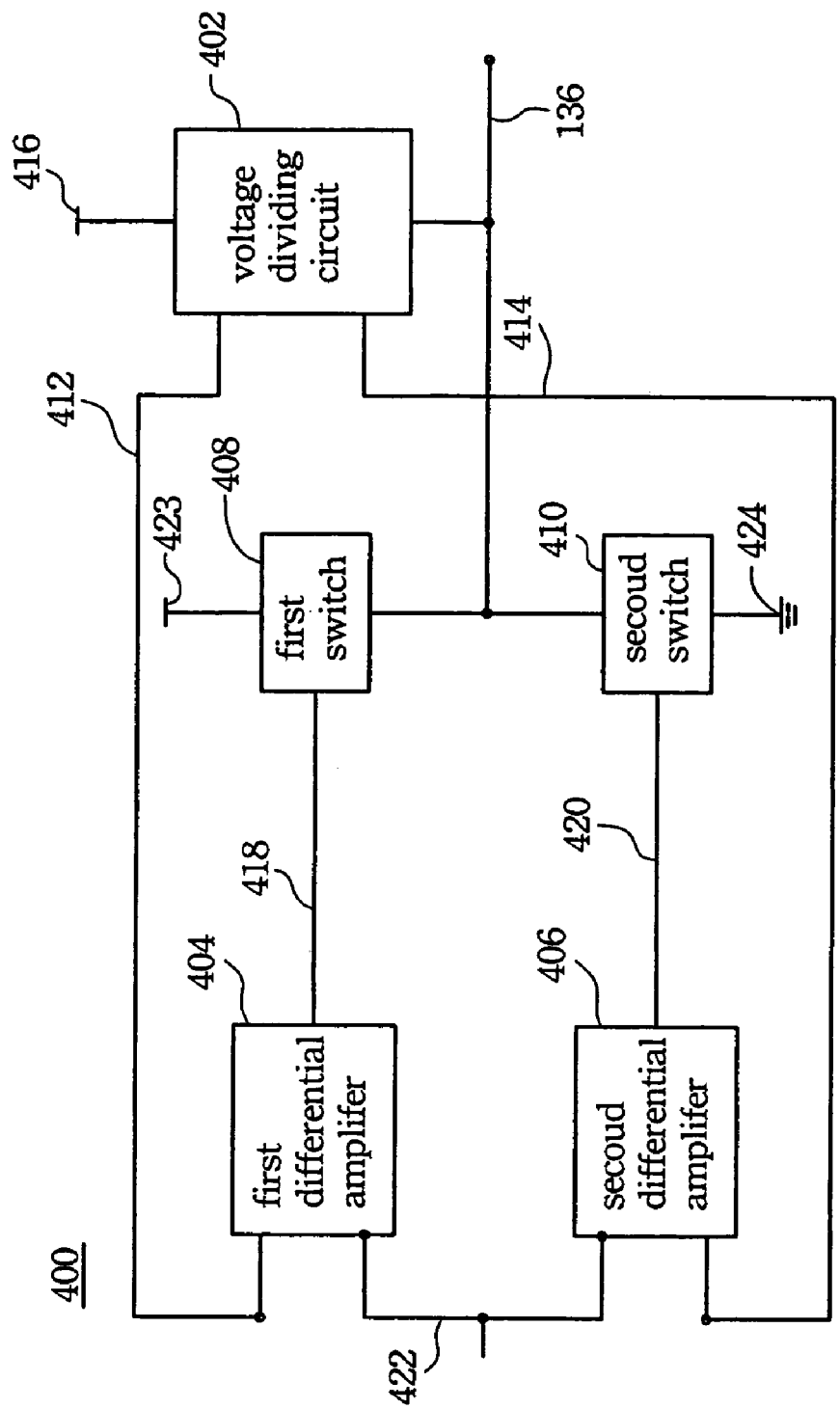
FIG. 4A is a block diagram illustrating the voltage generator of the invention.
FIG. 4B is a circuit diagram illustrating a preferred embodiment of the voltage generator.

FIG. 4A is a block diagram illustrating the voltage generator of the invention. With reference to FIG. 1C and FIG. 4A, the voltage generator 400 can be used as the voltage generator circuit 132 for generating a substantially stable voltage, VEQ 136. The voltage generator 400 includes a voltage dividing circuit 402, a first differential amplifier 404, a second differential amplifier 406, a first switch 408, and a second switch 410.

The voltage dividing circuit 402 generates a first input voltage 412 and a second input voltage 414 according to a high reference voltage 416 and a generator output voltage 136, VEQ. The high reference voltage 416 is higher than the first input voltage 412. The first input voltage 412 is higher than the second input voltage 414. The second input voltage 414 is higher than the generator output voltage 136, VEQ.

The first differential amplifier 404 generates a first output voltage signal 418 in response to a reference input voltage 422 and the first input voltage 412. The second differential amplifier 406 generates a second output voltage signal 420 in response to the reference input voltage 422 and the second input voltage 414.

The first switch 408 provides a high voltage source 423 to the generator output voltage 136 when the first output voltage signal 418 is at high state. The second switch 410 provides a low voltage source 424 to the generator output voltage 136 when the second output voltage 420 is at high state.

When the first input voltage 412 is lower than the reference input voltage 422, the first output voltage signal 418 is at high state so that the generator output voltage 136 increases. When the second input voltage 414 is higher than the reference input voltage 422, the second output voltage signal 420 is at high state so that the generator output voltage 136 decreases.

Figure 4B:
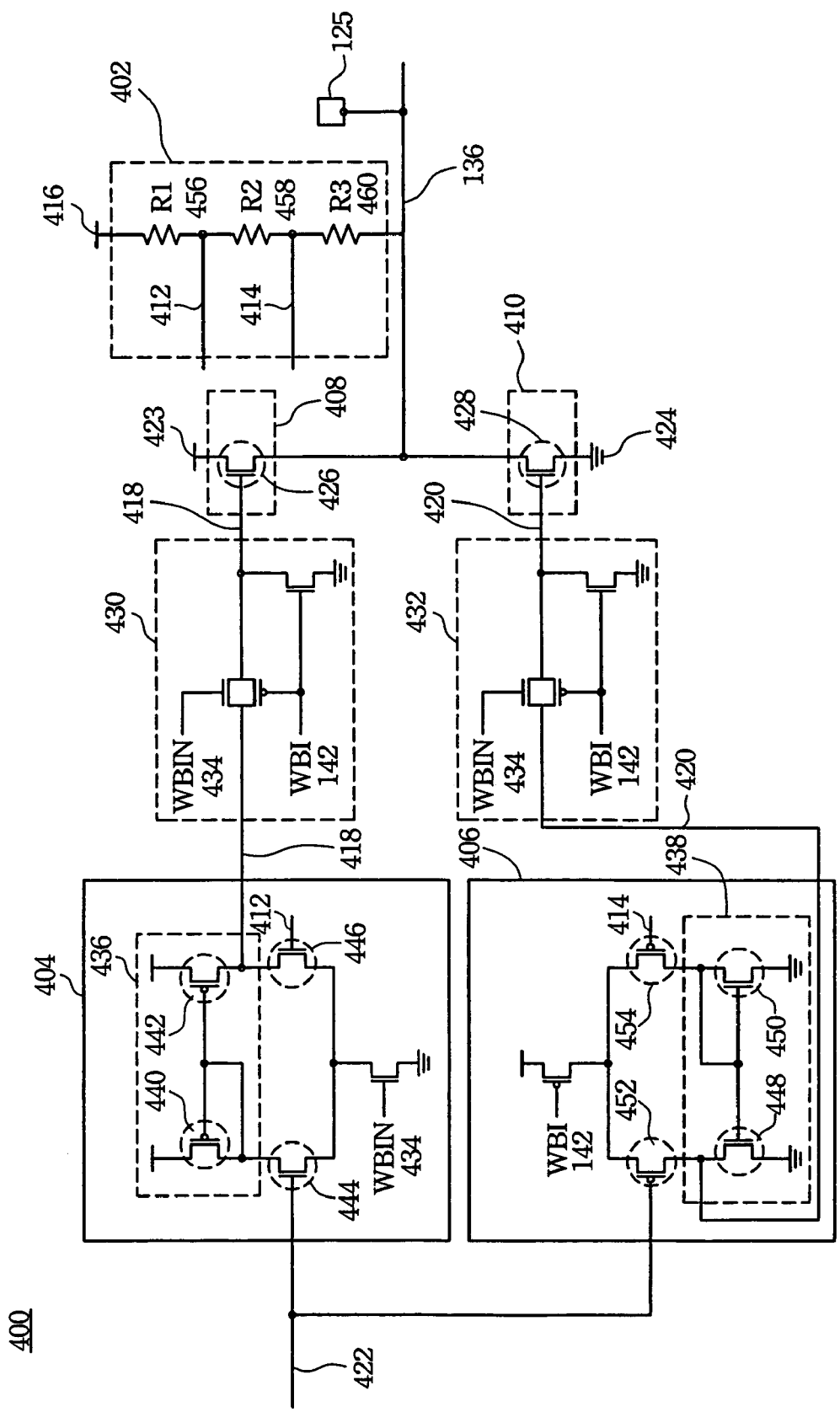

FIG. 4B is a circuit diagram illustrating a preferred embodiment of the voltage generator. In the embodiment, the first switch 408 is, for example, a MOS transistor 426 and the second switch 410 is, for example, a MOS transistor 428. The gate of the MOS transistor 426 of the first switch 408 is connected to the first output voltage signal 418. The drain of the MOS transistor 426 of the first switch 408 is connected to the high voltage source 423.

The source of the MOS transistor 426 of the first switch 408 is connected to the drain of the MOS transistor 428 of the second switch 410. The gate of the MOS transistor 428 of the second switch 410 is connected to the second output voltage signal 420. The source of the MOS transistor 428 of the second switch 410 is connected to the low voltage source 424. The drain of the MOS transistor 428 of the second switch 410 is connected to the generator output voltage 136.

With reference to FIG. 4B, a first mode switch circuit 430 is placed between the first differential amplifier 404 and the first switch 408. The first mode switch circuit 430 receives the burn-in test mode signal, WBI 142, and WBIN 434. WBIN 434 is the inverse of WBI 142.

A second mode switch circuit 432 is placed between the second differential amplifier 406 and the second switch 410. The second mode switch circuit 432 receives the burn-in test mode signal, WBI 142, and WBIN 434.

When the burn-in test mode signal, WBI 142, is enabled, the first mode switch circuit 430 disconnects the first output voltage signal 418 to the first switch 408 and the second mode switch circuit 432 disconnects the second output voltage signal 420 to the second switch 410. When the burn-in test mode signal, WBI 142, is disabled, the first mode switch circuit 430 connects the first output voltage signal 418 to the first switch 408 and the second mode switch circuit 434 connects the second output voltage signal 420 to the second switch 410.

In normal mode, the burn-in test mode signal, WBI 142 is at low state. Both the differential amplifier 404 and 406 are active. The differential amplifier 404 is a differential amplifier with a PMOS active load 436, PMOS transistors 440 and 442, and NMOS input port, NMOS transistors 444 and 446.

The differential amplifier 406 is a differential amplifier with a NMOS active load 438, NMOS transistors 448 and 450, and PMOS input port, PMOS transistors 452 and 454. R1 456, R2 458, and R3 460 construct a voltage dividing circuit 402 connected to the high reference voltage 416 and the cell plate voltage, VEQ 136. The voltage dividing circuit 402 is used to generate the first input voltage 412 and the second input voltage 414. The reference input voltage 422 is a reference input DC voltage generated by a band-gap voltage reference, for example. The value of the reference input voltage 422 is higher or equal to a half of the high reference voltage 416.

When the first input voltage 412 is lower than the reference input voltage 422, the first output voltage signal 418 is pulled high to turn on the MOS transistor 426 and to supply current from the high reference voltage 416 to the cell plate voltage, VEQ 136. When the second input voltage 414 is higher than the reference input voltage 422, the second output voltage signal 420 is pulled high to turn on the MOS transistor 428 and the current is sunk from the cell plate voltage, VEQ 136, to the low voltage source 424. The voltage generator 400 doesn't supply or sink current for the cell plate voltage, VEQ 136, in a well-defined range. The range is given by $$VCC-(VCC-Vref)*(R1+R2+R3)/R1 < VEQ <$$

$$VCC-(VCC-Vref)*(R1+R2+R3)/(R1+R2)$$

where VCC is, for example, the high reference voltage 416; Vref is the reference input voltage 422; and R1 456, R2 458, and R3 460 are the resistors in the voltage dividing circuit 402.

No process or device parameter is included in the above equation, because the voltage generator 400 is insensitive to process. In burn-in test mode, the MOS transistor 426 and 428 are turned off by WBI 142 at a high state and VEQ 136 is forced from test pad 128.

Figure 5:
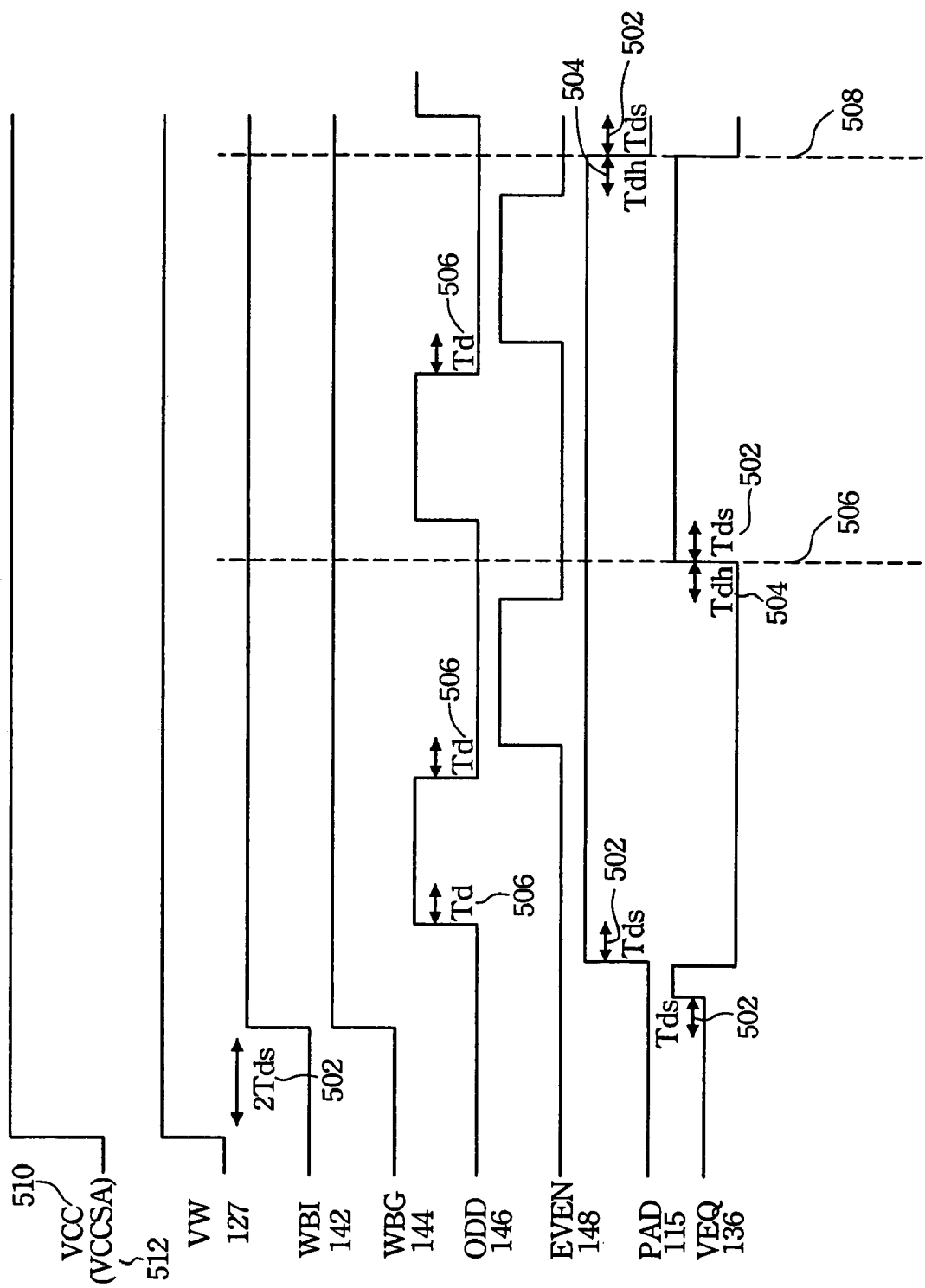
FIG. 5 is an example of the operational timing waveform for burn-in test mode.

FIG. 5 is an example of the operational timing waveform for burn-in test mode. The operational timing waveform is a method for performing a burn-in test on a memory device 102 (shown in FIG. 1A). With reference to FIG. 5, FIG. 1B, FIG. 1C, FIG. 2B, and FIG. 3B, the method includes the following steps. First, a predetermined high voltage 127, VW, is applied to the sources 216 of the first PMOS transistors 212 of the word line drivers 208. Next, the memory device 102 is informed with the burn-in test mode signal, WBI 142. Next, a word line stress voltage is applied to the word lines 106 by providing WBG 144, ODD 146, and EVEN 148. Next, the cell plate voltage, VEQ 136, is applied to the storage capacitors 116 of the array of memory cells 112. Next, a bit line stress voltage is applied to the bit lines from pad 115.

When applying the bit line stress voltage to the bit lines 110 (shown in FIG. 1B), alternately switching the cell plate voltage, VEQ 136, from a high state to a low state so that the voltage across a memory cell 112 connected to a bit line 346 (shown in FIG. 3B) and the voltage across the reference memory cell 344, the adjacent memory cell connected to the complementary bit line 348, is fully stressed by different voltage values.

The data-in setup time, Tds 502, and the data-in hold time, Tdh 504, is reserved at the rising edge 506 and the falling edge 508 of the alternately switching cell plate voltage, VEQ 136. By alternately switching ODD 146 AND even 148, as shown in FIG. 5, the even word lines and the odd word lines are grouped by EVEN 148 and ODD 146, respectively, and the word line stress voltage is applied to the even word lines and to the odd word lines alternately. In FIG. 2B, the even word lines are represented by WL_(2n) 211 and the odd word lines are represented by WL_(2n−1) 215. The time needed for the word line transition delay. Td 506, is placed between the alternately switching word line stress voltage applied to the even word lines 211 and the odd word lines 215.

The timing parameters, Td 506, Tds 502, and Tdh 504, are defined to avoid power contention and reduce the operation peak current. The power level of VCC 510 or VCCSA 512 decide the power operation of the memory device 102 (shown in FIG. 1A) and how much voltage to be stored in the storage capacitor 116 (shown in FIG. 1B), as described previously.

The voltage across a memory cell 112 is equal to VCC-Vthn' or VSS. The high level of WBI 142 and test pad 111, 109, 107, and 115 (shown in FIG. 1C) are, for example, equal to VCC and used to execute the burn-in test. The high level of VW 127 decides the gate 118 (shown in FIG. 1B) of the access transistor 114 of the memory cell 112 to be stressed under the voltage of VW-Vthn. The high and low states of the test pad 128, cell plate voltage, VEQ 136, decide how much electric field is applied across the insulator film of the storage capacitor 116 (shown in FIG. 1B). The burn-in test mode signal, WBI 142, is enabled 2Tds after VW 127 rises. Early in the burn-in test mode, the ODD 146 AND even 148 must be maintained at the low state to ensure that the word line drivers 208 are in high impedance state. Besides, VEQ 136 is not forced yet to ensure that there is no contention to the voltage generator circuit 132.

In the example shown in FIG. 5, the lowest frequency is test pad 115. The frequency of VEQ 136 is doubled, and the frequency of EVEN 148 and ODD 146 are quadrupled. EVEN 148 and ODD 146 are turned on alternately to stress the gate 118 of the access transistor 114 and the adjacent word line. The voltage to be written to the memory cell 112 can be one or zero, depending on the memory cell 112 coupled to the bit line 346 or the bit line bar 348, as shown in FIG. 3B. Therefore, the cell plate voltage, VEQ 136, needs to transit to another level and turn on odd and even word lines alternately to ensure all memory cells 112 are fully stressed by different voltage values.

Although the present invention has been described in considerable detail with reference to certain preferred embodiments thereof, other embodiments are possible. Therefore, their spirit and scope of the appended claims should no be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage generator for generating a substantially stable voltage, the voltage generator comprising:
   a voltage dividing circuit for generating a first input voltage and a second input voltage according to a high reference voltage and a generator output voltage, wherein the high reference voltage is higher than the first input voltage, the first input voltage is higher than the second input voltage, and the second input voltage is higher than the generator output voltage;
   a first differential amplifier for generating a first output voltage signal in response to a reference input voltage and the first input voltage;
   a second differential amplifier for generating a second output voltage signal in response to the reference input voltage and the second input voltage;
   a first switch for providing a high voltage source to the generator output voltage when the first output voltage signal is at high state; and
   a second switch for providing a low voltage source to the generator output voltage when the second output voltage signal is at high state: wherein
   when the first input voltage is lower than the reference input voltage, the first output voltage signal is at high state so that the generator output voltage increases; and
   when the second input voltage is higher than the reference input voltage, the second output voltage signal is at high state so that the generator output voltage decreases.

2. The voltage generator of claim 1, wherein the first switch is a MOS transistor and the second switch is a MOS transistor, the gate of the MOS transistor of the first switch is connected to the first output voltage signal, the drain of the MOS transistor of the first switch is connected to the high voltage source, the source of the MOS transistor of the first switch is connected to the drain of the MOS transistor of the second switch, the gate of the MOS transistor of the second switch is connected to the second output voltage signal, the source of the MOS transistor of the second switch is connected to the low voltage source, and the drain of the MOS transistor of the second switch is connected to the generator output voltage.

3. The voltage generator of claim 2, further comprising:
a first mode switch circuit placed between the first differential amplifier and the first switch, the first mode switch circuit receiving a burn-in test mode signal; and
a second mode switch circuit placed between the second differential amplifier and the second switch, the second mode switch circuit receiving the burn-in test mode signal; wherein when the burn-in test mode signal is enabled, the first mode switch circuit disconnects the first output voltage signal from the first switch and the second mode switch circuit disconnects the second output voltage signal from the second switch; and when the burn-in test mode signal is disabled, the first mode switch circuit connects the first outputs voltage signal to the first switch and the second mode switch circuit connects the second output voltage signal to the second switch.

* * * * *

UNITED STATES PATENT AND TRADEMARK OFFICE
CERTIFICATE OF CORRECTION

PATENT NO.        : 7,099,224 B2
APPLICATION NO. : 11/250073
DATED             : August 29, 2006
INVENTOR(S)       : Chou It is certified that error appears in the above-identified patent and that said Letters Patent is hereby corrected as shown below:

Title Page Item (63)
Please insert the following information on Page 1: --This application is a divisional of U.S. Application No. 10/724,657, filed December 1, 2003, now U.S. Patent No. 7,106,644.--

Signed and Sealed this

Second Day of January, 2007

JON W. DUDAS
*Director of the United States Patent and Trademark Office*